(12) United States Patent
Liu

(10) Patent No.: US 8,071,279 B2
(45) Date of Patent: Dec. 6, 2011

(54) PLANE WAVES TO CONTROL CRITICAL DIMENSION

(75) Inventor: Peng Liu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 12/316,787

(22) Filed: Dec. 16, 2008

(65) Prior Publication Data

US 2009/0104569 A1 Apr. 23, 2009

Related U.S. Application Data

(62) Division of application No. 11/026,257, filed on Dec. 30, 2004, now Pat. No. 7,517,642.

(51) Int. Cl.
*G03F 7/20* (2006.01)

(52) U.S. Cl. ........................................ 430/396; 430/945

(58) Field of Classification Search ...................... None
See application file for complete search history.

(56) References Cited

U.S. PATENT DOCUMENTS

| 5,815,247 A | 9/1998 | Poschenrieder et al. |
| 6,043,869 A | 3/2000 | Uno et al. |
| 6,352,800 B1 * | 3/2002 | Suganaga .................. 430/5 |
| 6,590,668 B1 | 7/2003 | Huber et al. |
| 6,765,681 B1 | 7/2004 | Sweetser et al. |
| 6,855,486 B1 | 2/2005 | Finders et al. |
| 6,991,895 B1 * | 1/2006 | Yen et al. ................ 430/394 |
| 7,974,027 B2 | 7/2011 | Liu |
| 2002/0166107 A1 | 11/2002 | Capodieci et al. |
| 2004/0170926 A1 | 9/2004 | Chandhok |
| 2005/0007573 A1 | 1/2005 | Hansen et al. |
| 2005/0102648 A1 | 5/2005 | Hsu et al. |
| 2005/0243440 A1 | 11/2005 | Wu |

\* cited by examiner

*Primary Examiner* — John A. McPherson
(74) *Attorney, Agent, or Firm* — Winkle, PLLC

(57) ABSTRACT

The present invention describes an aperture including: an opaque plate; two sliver openings located in the opaque plate, the two sliver openings having rectangular shapes, the two sliver openings being parallel to each other.

The present invention further describes a method including: decomposing a pattern into horizontal sub-features and vertical sub-features; forming a first mask corresponding to the horizontal sub-features; forming a second mask corresponding to the vertical sub-features; forming a first aperture with two parallel horizontal sliver openings corresponding to the first mask; forming a second aperture with two parallel vertical sliver openings corresponding to the second mask; exposing a wafer using the first aperture and the first mask; exposing the wafer using the second aperture and the second mask; and exposing the wafer with the third mask.

8 Claims, 1 Drawing Sheet

020
PLANE WAVES TO CONTROL CRITICAL DIMENSION

CROSS REFERENCE TO RELATED APPLICATION

This is a Divisional Application of U.S. patent application Ser. No. 11/026,257 filed on Dec. 30, 2004 now U.S. Pat. No. 7,517,642 presently pending, therein.

BACKGROUND OF THE INVENTION

1. Field of the Invention

The present invention relates to the field of integrated circuit (IC) manufacturing, and more specifically, to a method of and an apparatus for using plane waves to control critical dimension (CD) for photolithography.

2. Discussion of Related Art

An IC device, such as a microprocessor, may be fabricated on a substrate, such as a wafer. The wafer may include many layers that have been formed by adding or removing material. The material may include semi-conducting material, such as silicon, or insulating material, such as silicon oxide, or conducting material, such as copper. Some processes that may be used to add material to the wafer may include chemical vapor deposition (CVD), sputtering, electroplating, oxidation, and ion implantation. Other processes that may be used to remove material, partly or completely, from the wafer may include wet etching, dry etching, and chemical-mechanical polishing (CMP).

Photolithography may be used in conjunction with certain processes to limit processing to a pattern of features on the wafer. A thin film of a light-sensitive material, such as a photoresist, is first coated on the wafer. A mask is used at each layer to define the pattern of features. The mask is aligned to the wafer in an imaging tool, such as a stepper or a scanner. The imaging tool couples light from a source with projection optics to expose a latent image in the photoresist. Dose is the amount of light energy that is delivered per unit area. Then, a developer solution selectively removes the photoresist to form a pattern that is a function of the portions that have been exposed. Subsequently, a dry or wet etchant may replicate the pattern printed in the photoresist into the material on the wafer.

The yield of the microprocessor fabricated on the wafer may depend on CD of the features in the pattern. When the CD of the feature is about the same size as the wavelength of the exposure light, diffraction of the exposure light will degrade the CD.

Thus, a need exists for a method of improving control of CD and an apparatus for improved control of CD.

DETAILED DESCRIPTION OF THE PRESENT INVENTION

Figure 1:
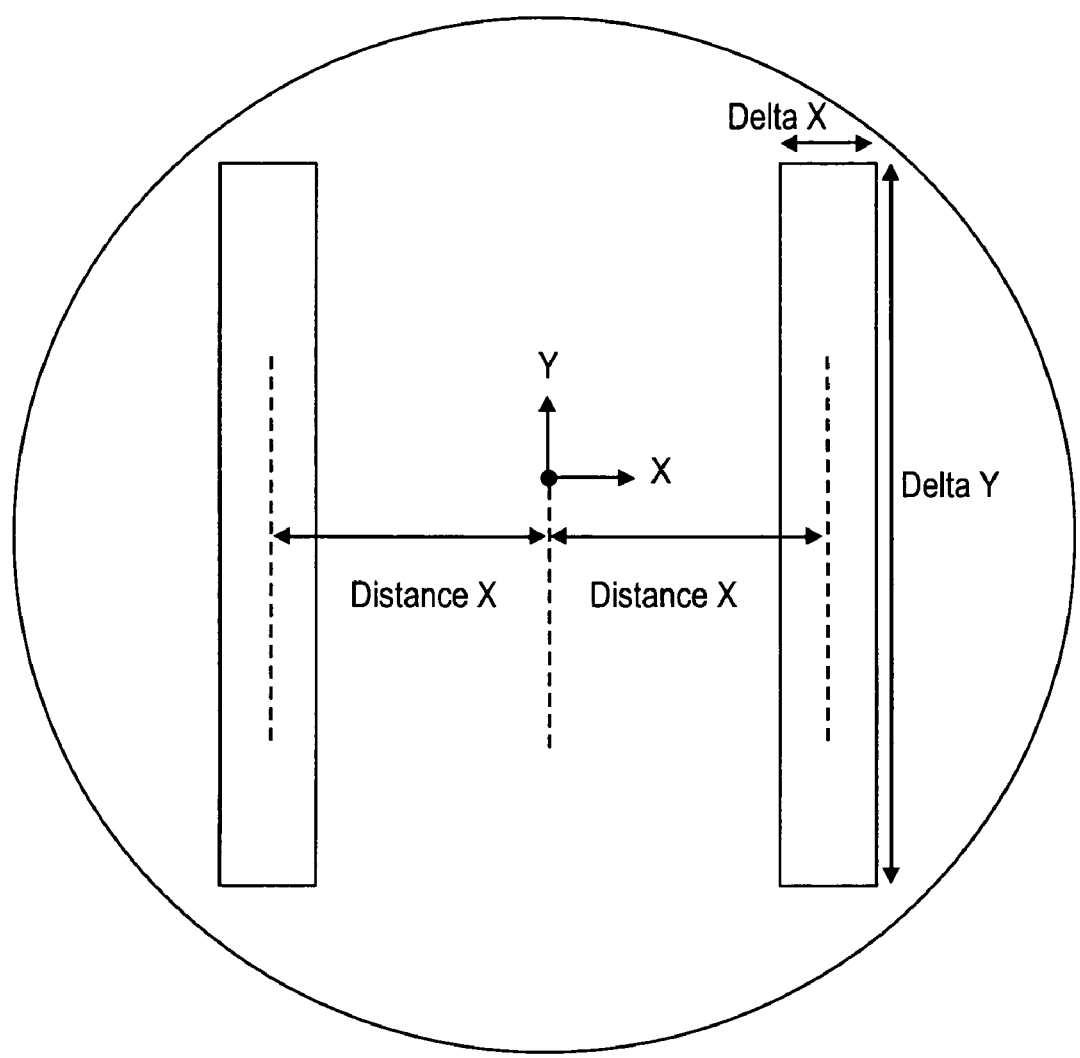
FIG. 1 is an illustration of a plane view of an embodiment of a masking aperture with two sliver openings that are parallel to each other and parallel to the y-axis and equidistant from the center of the aperture according to the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The yield of an integrated circuit (IC) device, such as a microprocessor, fabricated on a substrate, such as a wafer, may depend on fidelity of patterns on many layers. In particular, the critical dimension (CD) of certain features in the patterns may have to be controlled stringently.

The CD of a feature in a pattern may be influenced by a variety of systematic and random factors. One type of effect derives from the interaction of light with topography, film thickness, and reflectivity of the wafer. A second type of effect comes from non-uniformity of the features on a mask that defines the pattern in photoresist on the wafer. A third type of effect involves imprecision and inaccuracy of an imaging system that levels, focuses, aligns, and exposes the photoresist on the wafer. A fourth type of effect results from wavefront (phase) aberrations in the optics of the imaging system.

The imaging system may include mechanical, electrical, and optical subsystems that operate in conjunction with each other. The optical subsystems, or optics, may encompass refractive, reflective, catadioptric, and diffractive components that process the light. The optics may split or combine beams of light to deliver energy at certain times to certain locations in the imaging system.

The optics may include a lens. The lens may include one or more elements that direct, shape, or modulate light. The elements may act individually or collectively. The elements may operate in series or in parallel. The elements may control light in a passive or active manner.

Numerical Aperture (NA) of a lens is a measure of a maximum acceptance angle of light. The NA is equal to a product of a refractive index (n) of a medium through which light travels and a sine of a dispersion angle (alpha) of light that may be gathered by the lens. Alpha may refer to an angle that light spreads away from the optical axis. In an embodiment of the present invention, the NA may be varied by changing a size of an aperture stop at a pupil plane of the lens.

In conventional photolithography, light may travel through a gaseous, or dry, medium, such as air. In an embodiment of the present invention, the NA may be 0.40-0.70 for dry photolithography. In an embodiment of the present invention, the NA may be 0.70-1.00 for dry photolithography.

In immersion photolithography, light may travel through a liquid, or wet, medium, such as water. In an embodiment of the present invention, the NA may be 1.00-1.30 for immersion photolithography. In an embodiment of the present invention, the NA may be 1.30-1.60 for immersion photolithography.

The Rayleigh criteria define theoretical limits for the imaging system with a point source of light used for exposure. Resolution (R) refers to CD of the smallest feature in the pattern that may be consistently printed with acceptable fidelity. The resolution is proportional to a half-wavelength (lambda/2) of light used for exposure divided by the NA. Depth of focus (DOF) refers to a distance along a focal plane that may produce an image of acceptable fidelity. The DOF is proportional to (+/−) wavelength (lambda) of light used for exposure divided by square of the NA ($NA^2$).

Some of the light provided by the source in the imaging system may be gathered by a condenser lens to illuminate the mask. Some of the light that illuminates the mask may be propagated by the mask. In an embodiment of the present invention, a transmissive mask may transmit deep ultraviolet (DUV) light. Some of the light that may be propagated by the mask may be gathered by an objective lens to expose photoresist on the wafer.

The fidelity of the pattern in the photoresist may be degraded by a phenomenon of diffraction when the feature in the pattern on the mask becomes very small. In particular, when the CD of the feature on the mask is less than a half-wavelength (lambda/2) of light used for exposure, some of the diffracted orders of light may spread out so much that they fail to be gathered by the objective lens.

According to Abbe's theory of image formation, the $0^{th}$ order of light that propagates from the mask in the same direction as the incident (input) light only provides a baseline intensity while the higher orders of light, such as the (+/−) $1_{st}$ order and the (+/−) $2^{nd}$ order, that spread away symmetrically from the incident angle will provide higher spatial frequency information to define the features in the pattern. Consequently, at least some of the (+/−) $1^{st}$ diffracted order must be gathered by the objective lens to achieve adequate fidelity for the features in the pattern.

Any degradation in fidelity of the pattern in the photoresist may contribute to non-uniformity of CD, line-edge roughness, line-end shortening, corner rounding, bridging, and pattern collapse. Control of the CD of the feature may be improved by enhancing the process window, or latitude. The process latitude may be enhanced by increasing contrast. The process latitude may also be enhanced by increasing DOF.

A wider process latitude may be represented by a smaller $k_1$-factor. The $k_1$ factor, may be defined as (p/2)(NA/lambda) where (p/2) is a half-pitch, NA is numerical aperture, and lambda is wavelength of light used for exposure. A pitch of a periodic pattern of alternating lines and spaces refers to a sum of the CD of a line and the CD of an adjacent space. The periodic pattern is called 1:1 when the CD of the line equals the CD of the space. The half-pitch (p/2) refers to half of the pitch of the 1:1 periodic pattern.

The $k_1$-factor may depend on various factors, such as the type of feature being printed in the pattern and the type of light used for exposure. In an embodiment of the present invention, p may be 130 nanometers (nm), NA may be 0.90, lambda may be 193 nm, such that the $k_1$ factor may be 0.30. In an embodiment of the present invention, the $k_1$ factor may be 0.30-0.35. In an embodiment of the present invention, the $k_1$ factor may be 0.25-0.30.

In an embodiment of the present invention, an aerial image may be sharpened to improve fidelity of the features in the pattern to be printed in the photoresist. In an embodiment of the present invention, the aerial image contrast should be 0.8 or greater.

In an embodiment of the invention, the optical axis of the imaging system is perpendicular to the mask. Beta refers to an angle (with respect to the surface of the mask) that (input) light is incident on the mask. Normal, or perpendicular, incidence on the mask refers to a beta of 90 degrees. Oblique incidence on the mask refers to a non-normal, or non-perpendicular, incidence on the mask.

A value of beta may be determined as a function of pitch on the mask. The sine of beta in the x-orientation is equal to (+/−)(lambda)/(2$P_x$) where $P_x$ is a pitch in the x-orientation on the mask. The sine of beta in the y-orientation is equal to (+/−)(lambda)/(2$P_y$) where $P_y$ is a pitch in the y-orientation on the mask.

In an embodiment of the present invention, the aerial image may be sharpened by modifying (input) light incident on the mask. In an embodiment of the present invention, directing one or more tilted or obliquely-incident plane waves of light on the mask may be used to improve fidelity of the features in the pattern to be printed in photoresist. The depth of focus may be improved by using plane waves with oblique incidence on the mask.

In an embodiment of the present invention, the aerial image may be sharpened by modifying light propagated by the mask, such as by using a phase-shifting mask (PSM). The PSM may be a weak PSM or a strong PSM. In an embodiment of the present invention, the PSM may be used in conjunction with plane waves with oblique incidence on the mask.

The diffractive orders from an obliquely-incident plane wave will spread out symmetrically away from its oblique incidence to the mask. The light may become partially coherent for an obliquely-incident plane wave of light. A partial coherence factor, or sigma, refers to NA of the condenser lens ($NA_c$) divided by NA of the objective lens ($NA_o$). In the imaging system, the condenser lens is part of the illumination optics while the objective lens is part of the projection optics. In an embodiment of the present invention, the partial coherence factor may be 0.3-0.7.

Side-lobes or ringing may be seen in the photoresist when printing very small holes using a very low value of the partial coherence factor. Polarization effects by reflection (or transmission) may also become significant at a large angle (relative to Brewster's angle).

In an embodiment of the present invention, multiple laser beams may produce plane waves with oblique incidence on the mask.

In an embodiment of the present invention, refractive optical elements, such as beam-splitters, may produce plane waves with oblique incidence on the mask.

In an embodiment of the present invention, diffractive optical elements (DOEs) may produce plane waves with oblique incidence on the mask.

In an embodiment of the present invention, (masking) apertures at a pupil plane for a condenser lens may produce plane waves with oblique incidence on the mask.

In an embodiment of the present invention, the aperture may be a transparent plate with opaque portions.

In an embodiment of the present invention, the transparent portions of the aperture may have a low absorbance (low extinction coefficient) so as to maximize the amplitude of the transmitted light.

In an embodiment of the present invention, the transparent portions of the aperture may have a certain amount of absorbance so as to modulate the amplitude of the transmitted light.

In an embodiment of the present invention, the aperture may be formed from fused silica that is 20 mil thick. The fused silica may be transparent to light used for exposure having a wavelength of 248 nm or 193 nm. The opaque portions may be formed by coating a surface of the fused silica plate with a chromium film that is 800-1,000 Angstroms thick and patterning the film to create opaque regions having certain locations, shapes, and dimensions. A thin layer of chromium oxide may be formed (over the chromium film) to serve as an anti-reflective coating (ARC) to reduce reflectivity below 10% for light used for exposure having a wavelength of 248 nm or 193 nm.

In another embodiment of the present invention, the aperture may be an opaque plate with transparent portions. In an embodiment of the present invention, the aperture may be formed from metal, such as aluminum, or alloy or ceramic. The transparent portions may be formed by removing material through the thickness of the opaque plate to create openings having certain locations, shapes, and dimensions.

In an embodiment of the present invention, the aperture may be designed as a circular aperture that completely fills the pupil of the condenser lens. The circular aperture has no orientation dependency and permits the maximum amount of light to go through.

A circular aperture may be used with the embodiment of the present invention that uses multiple laser beams to form plane waves with oblique incidence on the mask.

A circular aperture may be used with the embodiment of the present invention that uses refractive optical elements, such as beam-splitters to form plane waves with oblique incidence on the mask.

A circular aperture may be used with the embodiment of the present invention that uses diffractive optical elements (DOEs) to form plane waves with oblique incidence on the mask.

A customized aperture may be used to form plane waves with oblique incidence on the mask.

In an embodiment of the present invention, the aperture may be designed with some obscuration to remove a portion of light that may not be helpful in printing the feature. In an embodiment of the present invention, the aperture may be obstructed in the center (at the optical axis). Central obscuration will prevent $0^{th}$ diffracted order from passing straight through the mask to the lens. In an embodiment of the present invention, central obscuration may occupy 4-20% of the pupil of the condenser lens. In an embodiment of the present invention, central obscuration may occupy 12% of the pupil of the condenser lens.

As the CD of the feature in the pattern becomes smaller, the within-field CD variability for the imaging system consumes an increasingly larger portion of the overall CD error budget, relative to the field-to-field CD variability.

In an embodiment of the present invention, the within-field CD variability may include a bias between two orthogonal orientations.

In an embodiment of the present invention, the within-field CD variability may include a bias between a horizontal orientation and a vertical orientation.

In an embodiment of the present invention, the within-field CD variability may include a bias between the x-axis and the y-axis.

In an embodiment of the present invention, the within-field CD variability may be related to wavefront (phase) aberrations in the illumination optics and the projection optics of the imaging system.

The primary aberrations may include defocus, astigmatism, coma, and spherical aberration. Defocus may include the Zernike circle polynomial $Z_4$. Astigmatism may include the Zernike circle polynomials $Z_5$ and $Z_6$. Coma may include the Zernike circle polynomials $Z_7$ and $Z_8$. Spherical aberration may include the Zernike circle polynomial $Z_9$. Furthermore, wavefront tilt may include Zernike circle polynomials $Z_2$ and $Z_3$.

Printing of aberrations that are radially-symmetric, such as defocus and spherical aberration, may be improved by obliquely-incident illumination (with central obscuration). Printing of aberrations that are non-radially symmetric, such as astigmatism and coma, (and also wavefront tilt) may be improved by normally-incident (90 degrees) illumination (without any central obscuration).

In an embodiment of the present invention, the within-field CD variability may be related to non-uniformity in the partial coherence factor between different orientations, such as the horizontal orientation and the vertical orientation.

In an embodiment of the present invention, when a scanner, rather than a stepper, is used as the imaging system, the within-field CD variability may be related to a cross-scan CD variability and a cross-slot CD variability.

In an embodiment of the present invention, the within-field CD variability may be related to a proximity effect, such as an iso-dense bias. The iso-dense bias may refer to a difference, or bias, between CD of an isolated feature and CD of a nested, or dense, feature in the pattern.

In an embodiment of the present invention, the feature in the pattern may be a hole, such as at a contact layer or a via layer of an IC device. In an embodiment of the present invention, the feature in the pattern may be a line, such as at an isolation layer, a gate layer, or a metal layer of an IC device.

In an embodiment of the present invention, the features in the pattern may be categorized as dense, semi-dense, semi-isolated, or isolated, depending on a linewidth-to-space ratio, or duty cycle. A pitch refers to a sum of the CD of a line and the CD of an adjacent space. The pitch has a duty cycle of 1:1 if the CD of the line is equal to the CD of the adjacent space. A dense feature refers to a duty cycle of 1:1 or smaller. A semi-dense feature refers to a duty cycle, of 1:1-1:3. A semi-isolated feature refers to a duty cycle of 1:3-1:5. An isolated feature refers to a duty cycle of 1:5 or larger.

In an embodiment of the present invention, features in the pattern may be categorized more generally as essentially-dense or essentially-isolated, depending on the line-to-space width ratio, or duty cycle. An essentially-dense feature in the pattern refers to a duty cycle smaller than 1:3. An essentially-isolated feature in the pattern refers to a duty cycle larger than 1:3.

Printing of an essentially-isolated feature in the pattern may be performed with a circular aperture without any central obscuration since many diffracted orders of light may be gathered and combined, either constructively or destructively, by the lens.

Printing of an essentially-dense feature in the pattern may be performed with an aperture with central obscuration. As the pitch is reduced, fewer diffracted orders of light may be gathered and combined by the lens so illuminating the mask at an oblique angle may permit at least a $1^{st}$ diffracted order of light to be gathered. The higher diffracted orders of light, such as $(+/1^{st}$ diffracted order and $(+/-)$ $2^{nd}$ diffracted order, provide higher spatial frequency information that is needed to improve fidelity of features in the pattern.

In an embodiment of the present invention, a minimum of two orders of light should be gathered by the lens in order to achieve sufficient fidelity of features in the pattern.

In an embodiment of the present invention, plane waves with oblique incidence on the mask permit the lens to gather $0^{th}$ order and $+1^{st}$ order to achieve sufficient fidelity of features in the pattern.

In an embodiment of the present invention, plane waves with oblique incidence on the mask permit the lens to gather $0^{th}$ order and $1^{st}$ order to achieve sufficient fidelity of features in the pattern.

In an embodiment of the present invention, plane waves with oblique incidence on the mask permit the lens to gather $-1_{st}$ order and $+1^{st}$ order to achieve sufficient fidelity of features in the pattern.

In an embodiment of the present invention, plane waves with oblique incidence on the mask permit the lens to gather $-1^{st}$ order and $-2^{nd}$ order to achieve sufficient fidelity of features in the pattern.

In an embodiment of the present invention, plane waves with oblique incidence on the mask permit the lens to gather $+1^{st}$ order and $+2^{nd}$ order to achieve sufficient fidelity of features in the pattern.

As the pitch is reduced, the illumination parameters and conditions that improve essentially-isolated features may deviate from the illumination parameters and conditions that improve essentially-dense features. In an embodiment of the present invention, no overlap may exist between the illumination parameters or conditions required to provide the resolution and the depth of focus for the essentially-isolated features and the illumination parameters or conditions required to provide the resolution and the depth of focus for the essentially-dense features. Consequently, other measures may have to be taken to reduce the iso-dense bias for CD to a desired level.

In an embodiment of the present invention, the design and layout of a layer of an IC device may be decomposed into two orthogonal sets of sub-features.

In an embodiment of the present invention, the pattern on a layer may include features with rectilinear orientation. In an embodiment of the present invention, the pattern on a layer may include dense features with mostly x-orientation and/or mostly y-orientation. Such a dense rectilinear pattern may be called "Manhattan geometry".

In an embodiment of the present invention, the dense rectilinear pattern on a mask may be separated into horizontal ("H") sub-features and vertical ("V") sub-features. The horizontal sub-features may be placed on an "H" mask while the vertical sub-features may be placed on a "V" mask. The illumination parameters and conditions (whether implemented using an embodiment with multiple laser beams or an embodiment with refractive optical elements or an embodiment with diffractive optical elements (DOEs) or an embodiment with masking apertures) may be optimized separately for the two masks. The two masks may then be used to stitch the "H" and "V" sub-features back together to reconstitute the desired pattern.

In an embodiment of the present invention, a third mask may be used to remove any artifact which may arise from stitching together the "H" and the "V" sub-features from the two masks. In an embodiment of the present invention, the artifacts may be removed by exposure and develop. In an embodiment of the present invention, the artifacts may be removed by etch.

In an embodiment of the present invention, the third mask may be used to add other features having non-Manhattan geometry. In an embodiment of the present invention, the third mask may be used to add dense hole arrays. In an embodiment of the present invention, the third mask may be used to add dense diagonal lines.

In an embodiment of the present invention, the third mask may be used with normal, or perpendicular, incidence to let $0^{th}$ diffracted order of light through to add isolated features.

As needed, optical proximity correction (OPC) may be implemented in a design on the mask to improve fidelity of the features in the pattern printed with incoherent or partially coherent illumination. The OPC increases the amplitudes of the higher spatial frequencies that help define edges and corners of the features in the pattern.

In an embodiment of the present invention, when plane waves with oblique incidence on the mask may be used to improve printing of dense features in the pattern, OPC may be particularly helpful for improving fidelity of isolated features in the pattern. The OPC may also help improve fidelity of semi-isolated features and semi-dense features that may be located near an array of dense features.

In an embodiment of the present invention, the OPC may directly modify the shape of a feature by adding sub-resolution features, such as hammerheads, serifs, and jogs, to certain portions of the feature in a design.

In an embodiment of the present invention, the OPC may add sub-resolution assist features, such as scattering bars, near to certain portions of a feature without directly modifying the shape of the feature itself in a design.

The OPC may be rule-based only, or model-based only, or a combination of rule-based and model-based. However, the resolution that may be achieved for the OPC may be limited by a minimum grid size used in the design. Furthermore, using OPC may greatly increase complexity of design and costs of fabricating masks.

In the following description, embodiments using apertures will be described. However, it is to be understood that equivalent embodiments not described here that use multiple laser beams or refractive optical elements or diffractive optical elements (DOEs) may produce essentially similar results.

In an embodiment of the present invention, an aperture with one or more sliver openings may be designed.

In an embodiment of the present invention, each sliver opening may differ in shape and dimensions to correspond to shape and dimensions of a desired plane wave.

In an embodiment of the present invention, each sliver opening may have a stretched polygonal shape.

In an embodiment of the present invention, each sliver opening may have a stretched rectilinear shape.

In an embodiment of the present invention, each sliver opening may be a rectangle with a length and a width. In an embodiment of the present invention, the aspect ratio (length:width) of the rectangular sliver opening may be 10:1-30:1. In an embodiment of the present invention, the aspect ratio of the rectangular sliver opening may be 30:1-100:1. In an embodiment of the present invention, the aspect ratio of the rectangular sliver opening may be 100:1-300:1.

The range of oblique angles permitted through the rectangular sliver opening becomes tighter (which may be more desirable) as the width of the sliver opening becomes smaller. However, the flux of the light also decreases (which may be less desirable) as the width of the sliver opening becomes smaller.

In an embodiment of the present invention, an aperture with two sliver openings may include one center sliver opening and one off-center sliver opening. The center sliver opening traverses the center of the aperture, but need not be symmetrically located relative to the center. The center refers to the optical axis. The off-center sliver opening does not include the center of the aperture and needs not be symmetrically located relative to the center.

In an embodiment of the present invention, an aperture with two sliver openings may include two off-center sliver openings.

In an embodiment of the present invention, an aperture with two sliver openings may include two narrow sliver openings that are parallel with each other.

In an embodiment of the present invention as shown in FIG. 1, the aperture has two sliver openings that are parallel to each other and parallel to the y-axis and equidistant from the center of the aperture. Each sliver opening has a shape of a rectangle with a length, (Delta Y), and a width, (Delta X). In an embodiment of the present invention, the centerline (mid-width) of each of the two sliver openings is located a distance, (Distance X), from the center of the aperture where the center of the aperture corresponds to the optical axis of the imaging system. In an embodiment of the present invention, (Distance X)=(lambda)/((2)(Pitch X)(NA)) where lambda is the wavelength of the light, (Pitch X) is the 1:1 pitch (of equal line and space) in the x-direction, and NA is the numerical aperture of the objective lens. In an embodiment of the present invention, (Delta Y)=(2)(1−(Distance X)$^2$)$^{0.5}$. In an embodiment of the present invention, (Delta X)=(A)/((2) (Delta Y)) where A=area of each sliver opening. The Area of each sliver opening is related to a dose of light that is needed to expose photoresist on the wafer.

In an embodiment of the present invention, an aperture with two sliver openings may include two narrow sliver openings that are perpendicular with each other.

In an embodiment of the present invention, the sliver openings may have a constant width.

In an embodiment of the present invention, the sliver openings may have a variable width.

In an embodiment of the present invention, the width of the sliver openings may vary continuously.

In an embodiment of the present invention, the width of the sliver openings may vary discretely.

In an embodiment of the present invention, the width of the sliver openings may vary as a function of distance from the center of the aperture.

In an embodiment of the present invention, the width of the sliver openings may become larger towards the center of the aperture.

In an embodiment of the present invention, the width of the sliver openings may become smaller towards the center of the aperture.

In an embodiment of the present invention, a material may be located in the sliver openings to modulate amplitude of transmitted light.

In an embodiment of the present invention, a material may be located in the sliver openings to shift phase of transmitted light.

As appropriate, the locations, shapes, and dimensions of the sliver openings may be further customized to compensate for variability due to other reasons, such as non-uniformities in the illumination or wavefront (phase) aberrations in the optics.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

I claim:

1. A method comprising:
   modifying an incident light;
   forming one or more obliquely-incident plane waves of said light;
   directing said one or more obliquely-incident plane waves of said light on a mask; and
   printing a pattern in a photoresist with said light and said mask;
   wherein said obliquely-incident plane waves of said light are formed from multiple laser beams.

2. The method of claim 1 wherein said plane waves comprise at least two orders of diffracted light.

3. The method of claim 1 further comprising: improving fidelity of features that are printed in said pattern.

4. The method of claim 1 further comprising: improving depth of focus of features that are printed with said mask.

5. The method of claim 1 further comprising improving control of critical dimension of features printed with said mask.

6. The method of claim 1 further comprising improving printing of aberrations that are radially-symmetric.

7. The method of claim 6 wherein said aberrations comprise defocus.

8. The method of claim 6 wherein said aberrations comprise spherical aberration.

* * * * *